(12) United States Patent
Okubo

(10) Patent No.: US 8,268,513 B2
(45) Date of Patent: Sep. 18, 2012

(54) MASK BLANK MANUFACTURING METHOD

(75) Inventor: Yasushi Okubo, Tokyo (JP)

(73) Assignee: Hoya Corporation, Tokyo (JP)

( * ) Notice: Subject to any disclaimer, the term of this patent is extended or adjusted under 35 U.S.C. 154(b) by 525 days.

(21) Appl. No.: 11/667,191

(22) PCT Filed: Nov. 4, 2005

(86) PCT No.: PCT/JP2005/020276
§ 371 (c)(1),
(2), (4) Date: May 7, 2007

(87) PCT Pub. No.: WO2006/049240
PCT Pub. Date: May 11, 2006

(65) Prior Publication Data
US 2007/0264583 A1    Nov. 15, 2007

(30) Foreign Application Priority Data

Nov. 8, 2004  (JP) .................................. 2004-323444

(51) Int. Cl.
*G03F 1/68* (2012.01)
*G03F 1/70* (2012.01)
(52) U.S. Cl. ............................................... 430/4; 430/5
(58) Field of Classification Search .................. 430/4–5
See application file for complete search history.

(56) References Cited

U.S. PATENT DOCUMENTS

| | | | |
|---|---|---|---|
| 6,165,649 A | 12/2000 | Grenon et al. | |
| 6,765,673 B1 | 7/2004 | Higashikawa | |
| 2002/0006555 A1 | 1/2002 | Hasegawa et al. | |
| 2002/0022185 A1 * | 2/2002 | Tanaka et al. | 430/5 |
| 2002/0052100 A1 | 5/2002 | Tanaka et al. | |
| 2003/0019782 A1 * | 1/2003 | Angelopoulos et al. | 206/710 |
| 2003/0082460 A1 * | 5/2003 | Stivers et al. | 430/5 |
| 2006/0159931 A1 * | 7/2006 | Suzuki et al. | 430/5 |

FOREIGN PATENT DOCUMENTS

| | | |
|---|---|---|
| JP | 62-210467 A | 9/1987 |
| JP | 11015127 A | 1/1999 |
| JP | 2002-328463 A | 11/2002 |

(Continued)

OTHER PUBLICATIONS

Taiwan Office Action (Notice of Allowance) dated Nov. 28, 2008.

(Continued)

*Primary Examiner* — Mark F Huff
*Assistant Examiner* — John S Ruggles
(74) *Attorney, Agent, or Firm* — Sughrue Mion, PLLC

(57) ABSTRACT

A method of manufacturing a mask blank includes a thin film forming step of forming a thin film, which becomes a mask pattern, on a mask blank substrate and a resist film forming step of forming a resist film on the thin film. The method further includes a step of storing resist film forming information including information about a date of formation of the resist film on the thin film, a step of correlating the resist film forming information with the mask blank, a step of identifying, based on the resist film forming information, the mask blank having the resist film whose sensitivity change exceeds an allowable range, a step of stripping the resist film formed in the identified mask blank, and a step of forming again a resist film on the thin film stripped of the resist film.

19 Claims, 4 Drawing Sheets

FOREIGN PATENT DOCUMENTS

| | | |
|---|---|---|
| JP | 2003-149793 A | 5/2003 |
| JP | 200488072 A | 3/2004 |
| JP | 2004-109557 A | 4/2004 |
| TW | 490737 | 6/2002 |
| TW | 200302392 A | 8/2003 |

OTHER PUBLICATIONS

Japanese Office Action corresponding to Japanese Patent Application No. 2005-321261, dated Mar. 23, 2011.

* cited by examiner

[FIG. 1]
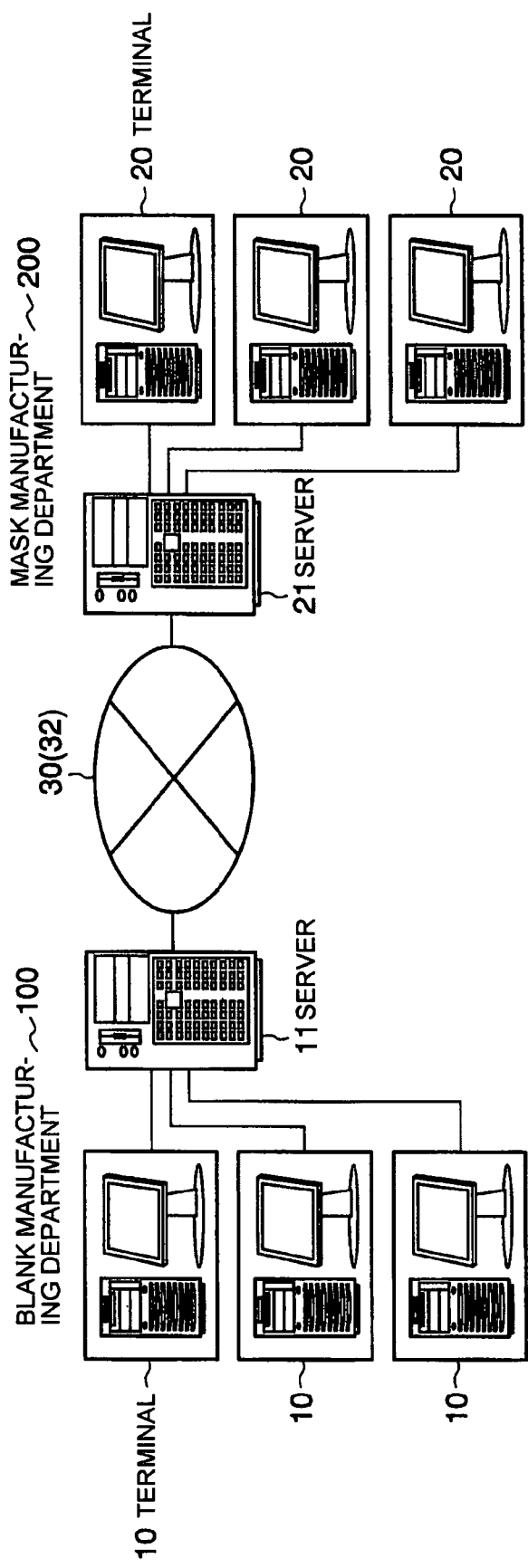

[FIG. 2]
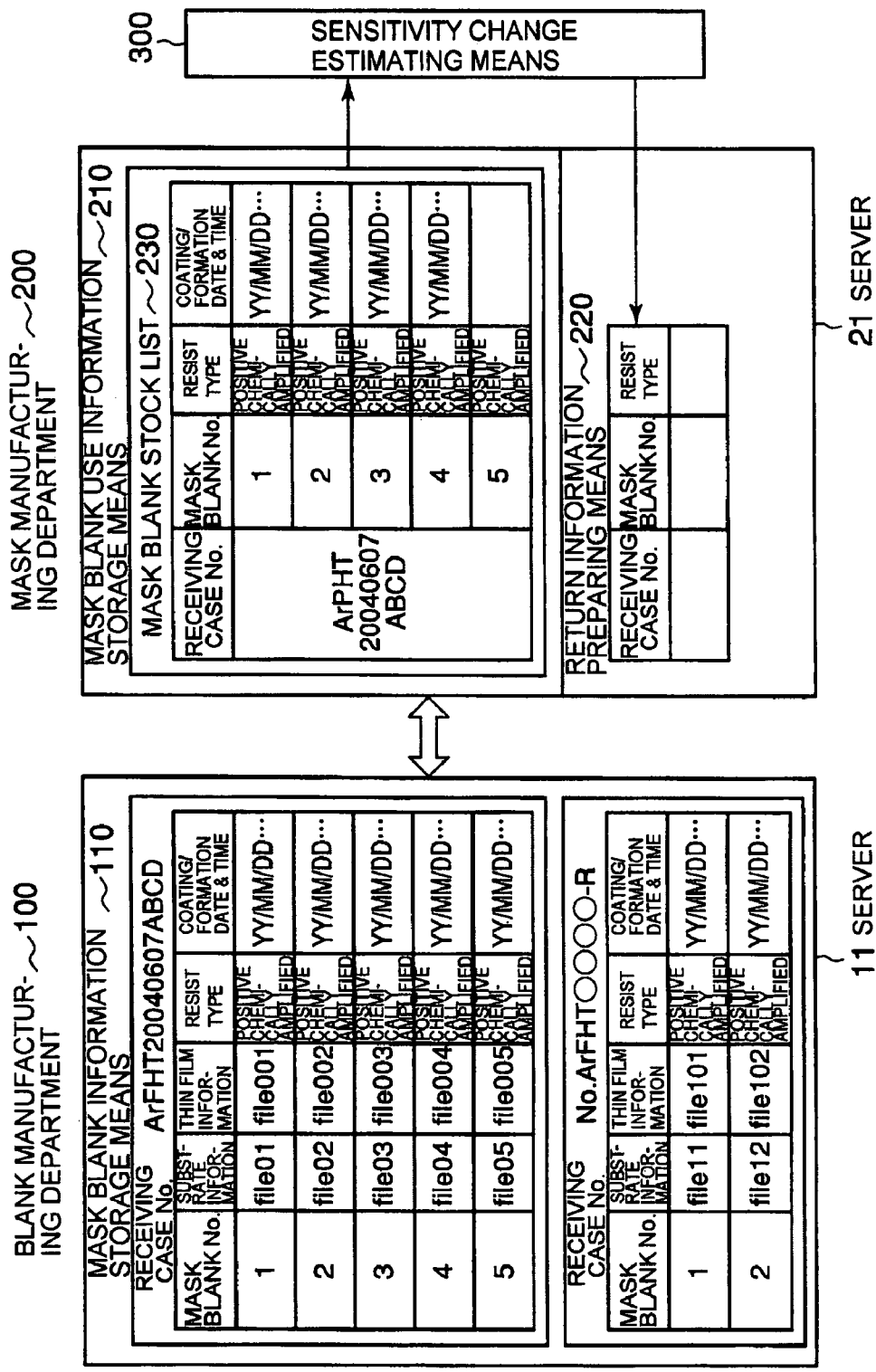

[FIG. 3]
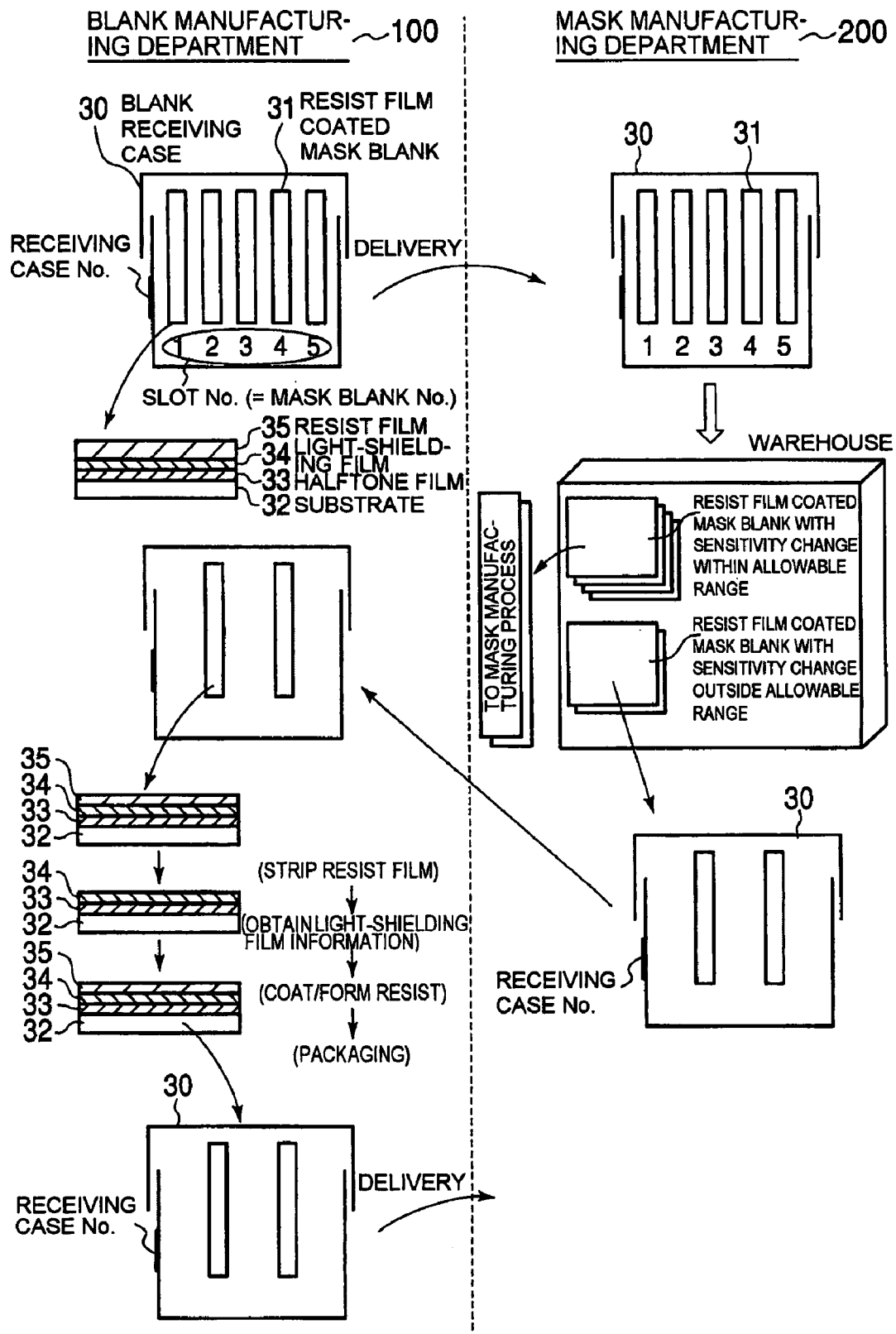

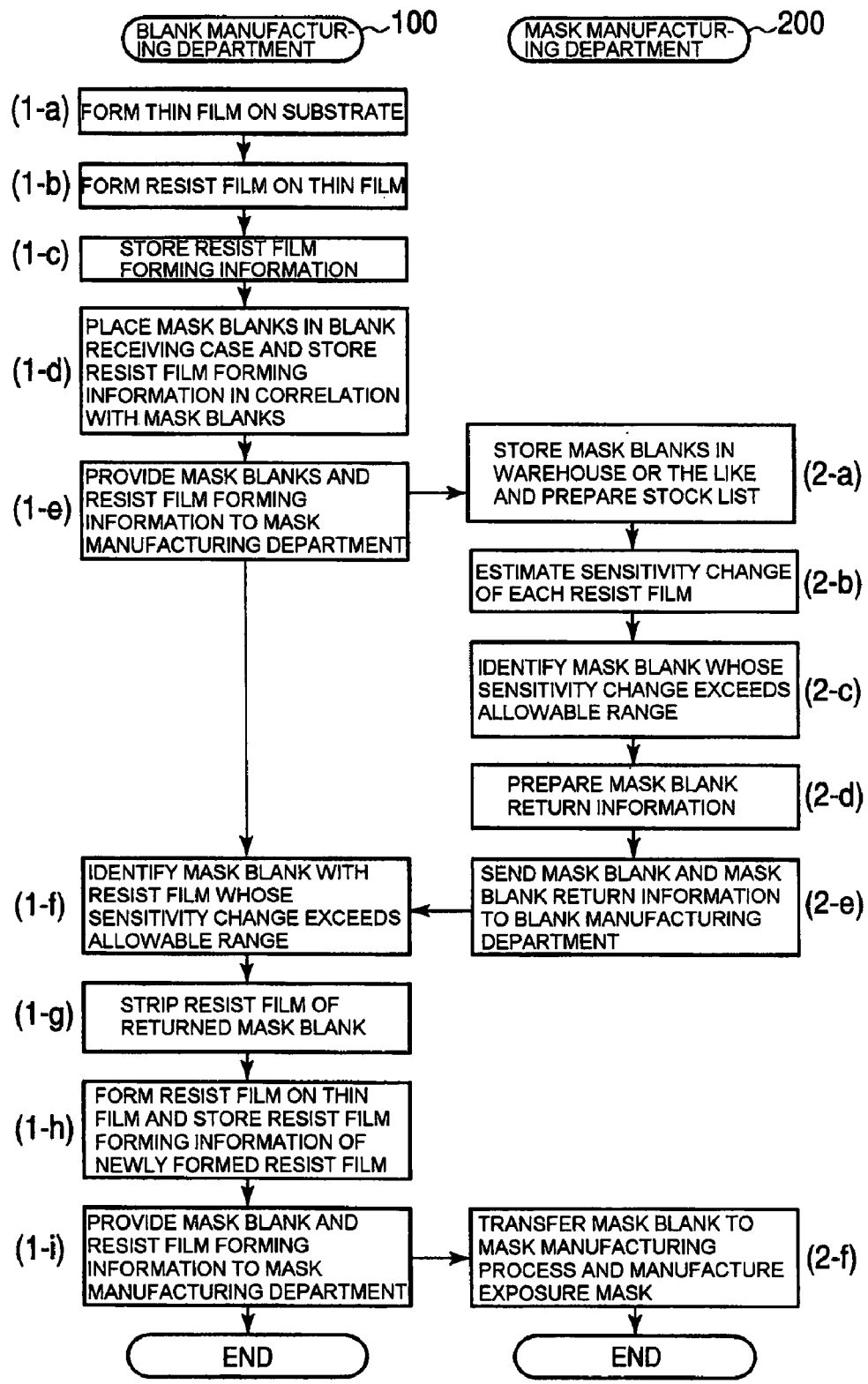
[FIG. 4]

MASK BLANK MANUFACTURING METHOD

TECHNICAL FIELD

This invention relates to a mask blank manufacturing method, a mask manufacturing method, a mask blank managing system, and a mask blank recycling method and, in particular, relates to a mask blank manufacturing method and a mask blank managing system that can suppress occurrence of CD (critical dimension:minimum size) failure caused by a change in sensitivity of a resist film in the manufacture of an exposure mask. Further, this invention relates to a mask blank recycling method that can recycle and effectively use a mask blank with a resist film whose change in sensitivity exceeds an allowable range to cause CD failure.

BACKGROUND ART

A resist film coated mask blank being a base of an exposure mask for use in semiconductor manufacturing has been known. In recent years, in the mask blank of this type, necessity for a chemically amplified resist having high resolution has been gradually increasing following miniaturization and complexity of circuit patterns formed on a semiconductor.

The chemically amplified resist is poor in sensitivity stability after resist coating as compared with other resists and is subjected to occurrence of a change in resist sensitivity according to an elapsed time from the resist coating to a writing process or a storage environment after the resist coating. Therefore, a mask manufacturing department (mask maker, device maker, or the like), serving to manufacture exposure masks, performs exposure amount correction or the like based on the experimental rule to thereby suppress CD (critical dimension:minimum size) degradation or variation.

Further, in recent years, it has been proposed to provide various information to a mask manufacturing department in order to improve the yield of exposure masks or the like (see Japanese Unexamined Patent Application Publication (JP-A) No. 2002-328463 (Patent Document 1) and Japanese Unexamined Patent Application Publication (JP-A) No. 2003-149793 (Patent Document 2)). For example, in Patent Document 2, when providing mask blanks to a mask manufacturing department from a blank manufacturing department (blank maker or the like), defect information of those mask blanks is provided. In this manner, in the mask manufacturing department, it becomes possible to improve the yield of exposure masks by selecting proper mask blanks based on the defect information and pattern data.

DISCLOSURE OF THE INVENTION

Problem to be Solved by the Invention

In the mask manufacturing department, days and times from the reception of the mask blanks from the blank manufacturing department (from coating/formation of resist films) to writing are not constant. This is because the mask manufacturing department receives the mask blanks by totalizing the types and numbers of mask blanks expected to be necessary for a certain period of time according to exposure schedules of exposure apparatuses in a semiconductor manufacturing department (semiconductor maker or the like) and calculating an estimated demand from the number of mask blanks demanded in the past, thereby giving an order to the blank manufacturing department.

In recent years, following the increase in resolution of the chemically amplified resist, a change in resist sensitivity due to the time from the coating/formation of the resist film to the writing increases. When the change in resist sensitivity exceeds an allowable range, it becomes difficult to correct the change in resist sensitivity, resulting in CD failure. The occurrence of the failure due to such a change in resist sensitivity cannot be avoided even by providing various information to the mask manufacturing department like in Patent Documents 1 and 2.

This invention has been made under the foregoing circumstances and its object is, firstly, to provide a mask blank and mask manufacturing method and a mask blank managing system that can suppress occurrence of CD failure caused by a change in resist sensitivity in the manufacture of an exposure mask.

Secondly, its object is to provide a mask blank recycling method that can effectively use a mask blank with a resist film whose change in sensitivity exceeds an allowable range to cause CD failure.

Means for Solving the Problem

In order to solve the foregoing objects, according to this invention, there is provided a mask blank manufacturing method including a thin film forming step of forming a thin film, which becomes a mask pattern, on a mask blank substrate and a resist film forming step of forming a resist film on the thin film, comprising the steps of storing resist film forming information including information about a date of formation of the resist film on the thin film, correlating the resist film forming information with the mask blank, identifying, based on the resist film forming information, the mask blank having the resist film whose sensitivity change exceeds an allowable range, stripping the resist film formed in the identified mask blank, and forming again a resist film on the thin film stripped of the resist film.

The mask blank manufacturing method according to this invention further comprises the step of obtaining and storing film information of the thin film relating to a specification of the mask blank at the time of or after the formation of the thin film.

According to the above-mentioned method, when stripping the resist film whose sensitivity change exceeds the allowable range and forming again a resist film on the thin film, part or whole of the film information about the thin film stored in correlation with the mask blank can be utilized. As a result, part or whole of the step of obtaining and storing the film information can be omitted. Therefore, a resist film coated mask blank formed with the resist film again can be quickly manufactured and provided to a mask manufacturing department. Further, in the mask manufacturing department provided with the foregoing mask blank, it is possible to securely avoid use of the resist film coated mask blank having the resist film whose sensitivity change exceeds the allowable range. In this manner, it is possible to prevent occurrence of CD failure due to a change in resist sensitivity.

The mask blank manufacturing method according to this invention comprises the steps of obtaining and storing substrate information of the mask blank substrate relating to a specification of the mask blank, and correlating the substrate information with the mask blank.

According to the above-mentioned method, when stripping the resist film whose sensitivity change exceeds the allowable range and forming again a resist film on the thin film, it is possible to use the substrate information that cannot be obtained without stripping the thin film. Specifically, in the case where the substrate information is required, a step of stripping the thin film can be omitted.

In the mask blank manufacturing method according this invention, the film information includes any of defect information, optical property information, thin film forming information, and surface form information.

According to this, when forming again the resist film on the thin film, it is possible to omit time and labor for obtaining the foregoing information, which takes much time. Therefore, a greater effect can be achieved in terms of shortening the manufacturing time.

In the mask blank manufacturing method according to this invention, the substrate information includes any of defect information, optical property information, and surface form information.

According to this, when forming again the resist film on the thin film, it is possible to use the foregoing information that cannot be obtained without stripping the thin film.

The mask blank manufacturing method according to this invention further comprises the step of directly or indirectly assigning identification information to the mask blank so as to enable correlation between the mask blank and the resist film forming information, film information of the thin film and/or information of the substrate.

According to the above-mentioned method, it is possible to ensure correlation between the resist film coated mask blank and the resist film forming information about the formation of the resist film, the film information of the thin film and/or the substrate information to thereby prevent misunderstanding of the information.

In the mask blank manufacturing method according to this invention, the resist film is a chemically amplified resist film.

According to the above-mentioned method, a great effect can be achieved by applying this invention to the chemically amplified resist film that is generally poor in sensitivity stability after the coating/formation.

A mask manufacturing method according to this invention comprises the step of patterning the thin film of the mask blank obtained by the mask blank manufacturing method according to this invention to thereby form a mask pattern on the mask blank substrate.

According to the above-mentioned method, when manufacturing a mask, it is possible to use the resist film coated mask blank having the resist film whose sensitivity change falls within the allowable range. In this manner, it is possible to prevent occurrence of CD failure due to a change in resist sensitivity.

According to this invention, there is also provided a mask blank managing system, comprising forming information storage means for storing resist film forming information including information about a date of formation of a resist film in a mask blank obtained by forming on a mask blank substrate a thin film, which becomes a mask pattern, and the resist film, identification information assigning means for assigning identification information to the mask blank, mask blank information storage means for storing the resist film forming information and the identification information in correlation with each other, and mask blank selecting means for identifying, based on the date information, the mask blank having the resist film whose sensitivity change exceeds an allowable range.

With this structure, when stripping the resist film whose sensitivity change exceeds the allowable range and recycling the mask blank, part or whole of film information about the thin film stored in correlation with the mask blank can be utilized. Since part or whole of the step of obtaining and storing the film information can be omitted when recycling the mask blank, a mask blank can be quickly manufactured and provided to the mask manufacturing department. Further, it is possible to securely correlate the resist film coated mask blank with the information about a date of the formation of the resist film and the film information of the thin film to thereby prevent misunderstanding of the information. Further, in the mask manufacturing department provided with the mask blank managed by this managing system, it is possible to securely avoid use of the resist film coated mask blank having the resist film whose sensitivity change exceeds the allowable range. In this manner, it is possible to prevent occurrence of CD failure due to a change in resist sensitivity.

The mask blank managing system according to this invention further comprises substrate information storage means and/or film information storage means for storing substrate information of the mask blank substrate and/or film information of the thin film relating to a specification of the mask blank. The substrate information and/or the film information is stored in the mask blank information storage means.

With this structure, when stripping the resist film whose sensitivity change exceeds the allowable range and recycling the mask blank, it is possible to use the substrate information that cannot be obtained without stripping the thin film.

The mask blank managing system according to this invention further comprises information transmission means so as to enable provision of the identification information, the resist film forming information, the film information, and/or the substrate information to a mask manufacturing department through a communication line.

With this structure, the information about the resist film coated mask blank, i.e. the resist film forming information, the film information, and/or the substrate information, can be quickly and accurately provided to the mask manufacturing department in correlation with the identification information.

The mask blank managing system according to this invention further comprises information receiving means so as to enable reception, through a communication line, of information about the mask blank having the resist film whose sensitivity change exceeds the allowable range, judged by a mask manufacturing department based on the resist film forming information.

With this structure, the information about the mask blank having the resist film whose sensitivity change exceeds the allowable range can be quickly and accurately received from the mask manufacturing department.

According to this invention, there is also provided a mask blank recycling method, comprising the steps of identifying a mask blank having the resist film whose sensitivity change exceeds an allowable range and stripping the resist film formed in the identified mask blank, based on resist film forming information including information about a date of formation of a resist film on a mask blank substrate, and forming again a resist film on a thin film stripped of the resist film.

According to the above-mentioned method, it is possible to effectively utilize the mask blank having the resist film whose sensitivity change exceeds the allowable range to cause CD failure.

In the mask blank recycling method according to claim this invention, the resist film is stripped with an alkaline solvent and/or an organic solvent.

According to the above-mentioned method, it is possible to strip the resist film without damaging the mask blank substrate and the thin film which will become a mask pattern.

According to this invention, there is also provided a mask blank manufacturing method for forming a resist film on a thin film of a thin film coated substrate formed on a mask blank substrate with the thin film which becomes a mask pattern, comprising the steps of storing, into forming information storage means, resist film forming information including information about a date of formation of the resist film on the thin film, correlating said resist film forming information, stored in the forming information storage means, with the mask blank, stripping the resist film of the mask blank having the resist film whose sensitivity change exceeds an allowable range, based on a correlation between the resist film forming information and the mask blank, and forming again a resist film on the thin film stripped of the resist film.

In the mask blank manufacturing method according to this invention, the resist film stripping step identifies the mask blank having the resist film whose sensitivity change exceeds the allowable range and strips the resist film formed in the identified mask blank.

Effect of the Invention

As described above, according to this invention, when manufacturing the exposure mask in the mask manufacturing department, it is possible to securely avoid use of the resist film coated mask blank having the resist film whose sensitivity change exceeds the allowable range. In this manner, it is possible to prevent occurrence of CD failure due to a change in resist sensitivity.

BRIEF DESCRIPTION OF THE DRAWINGS

FIG. 1 A block diagram showing a schematic structure of a mask blank managing system.

FIG. 2 An explanatory diagram showing exchange of information between a blank manufacturing department and a mask manufacturing department.

FIG. 3 An explanatory diagram showing exchange of articles between the blank manufacturing department and the mask manufacturing department.

FIG. 4 A flowchart showing a mask blank manufacturing method.

BEST MODE FOR CARRYING OUT THE INVENTION

Hereinbelow, embodiments of this invention will be described with reference to the drawings.
[Mask Blank Managing System]

At first, an embodiment of a mask blank managing system will be described with reference to FIGS. 1 to 3.

FIG. 1 is a block diagram showing a schematic structure of the mask blank managing system, FIG. 2 is an explanatory diagram showing exchange of information between a blank manufacturing department and a mask manufacturing department, and FIG. 3 is an explanatory diagram showing exchange of articles between the blank manufacturing department and the mask manufacturing department.

In this invention, the blank manufacturing department and the mask manufacturing department not only represent respective departments in the same corporation, but also represent a blank maker and a mask maker as different corporations.

As shown in FIG. 1, the mask blank managing system includes terminals 10 of the blank manufacturing department 100 serving to manufacture resist film coated mask blanks (hereinafter referred to as mask blanks), a server 11 collectively storing film information about thin films, forming information about resist films, identification information about mask blanks, and so on obtained in the blank manufacturing department 100, terminals 20 of the mask manufacturing department 200 serving to manufacture exposure masks, a server 21 collectively storing information indicative of use states of mask blanks in the mask manufacturing department 200, information about mask blanks each having a resist film whose change in sensitivity exceeds an allowable range, and so on, and a communication line 30 communicably connecting the servers 11 and 21 to each other. The terminals 10 and 20 are each in the form of a personal computer or the like. The communication line 30 may be in the form of a network 32 including the servers 11 and 21 or in the form of a leased line.

The terminal 10 of the blank manufacturing department 100 is disposed, for example, for each of mask blank manufacturing steps so that later-described substrate information, film information, and resist film forming information obtained in the respective steps are stored in the terminals 10. The terminals 10 are connected to the server 11 by a LAN so that those information is collected into the server 11.

As shown in FIG. 2, the server 11 of the blank manufacturing department 100 is provided with mask blank information storage means 110. In the mask blank information storage means 110, substrate information, thin film information, resist film forming information, and so on collected from the respective terminals 10 are stored in correlation with identification information of mask blanks to be provided to the mask manufacturing department 200. The substrate information includes defect information on the surface and the inside of a substrate, optical property information (transmittance etc.), surface form information (surface roughness, flatness, etc.), and so on. The thin film information includes defect information and optical property information (transmittance, reflectance, etc.) of a thin film, thin film forming information (film forming condition, film stress, etc.), surface form information (surface roughness, flatness, etc.), and so on. The resist film forming information includes information that affects a change in sensitivity of a resist film, i.e. specifically, a date and time (or a date) of coating/formation of a resist film on a substrate, a resist type, a heating condition, a mask blank storage environment, and so on.

The mask blank identification information is directly or indirectly given to each mask blank. In an example shown in FIGS. 2 and 3, a receiving case number of a blank receiving case 30 for use in delivery and a slot number assigned to each of receiving slots, adapted to hold mask blanks, of the blank receiving case 30 are used as identification information to identify the corresponding mask blank. In the case where the blank receiving case 30 is adapted to receive only a single mask blank, the receiving case number serves as identification information of the mask blank.

The server 21 of the mask manufacturing department is provided with mask blank use state storage means 210 and return information preparing means 220. The mask blank use state storage means 210 stores therein the use states of mask blanks in the mask manufacturing department 200. Specifically, the mask blank use state storage means 210 has a mask blank stock list 230 keeping information about a resist type, a resist film forming date and time, a mask blank storage environment, and so on in correlation with identification information of each of mask blanks provided from the blank manufacturing department 100 and, by deleting the used mask blank information from the list 230, the use states of the mask blanks are stored.

The return information preparing means 220 extracts, from among the unused mask blanks included in the mask blank stock list 230, those mask blanks each having a resist film whose change in sensitivity exceeds the allowable range, and prepares a return list of the mask blanks to be returned to the blank manufacturing department 100. The mask blank return list includes data such as identification information (blank receiving case number, slot number, etc.) and a resist type of each of the mask blanks to be returned. Specifically, the return information preparing means 220 uses sensitivity change estimating means adapted to estimate a change in sensitivity of the resist film based on the resist film forming information, the mask blank storage environment in the mask manufacturing department 200, and so on to thereby identify the mask blank with the resist film whose change in sensitivity exceeds the allowable range and prepare the return list.

The sensitivity change estimating means 300 can be provided for the terminals 10 or the server 11 of the blank manufacturing department 100 and/or the terminals 20 or the server 21 of the mask manufacturing department 200. In the case where the blank manufacturing department 100 estimates a change in sensitivity of a resist film by the use of the sensitivity change estimating means 300, the mask blank stock list information of the mask manufacturing department 200 may be shared by the mask manufacturing department 200 and the blank manufacturing department 100.

<Mask Blank Manufacturing Method and Mask Blank Providing Method>

Next, an embodiment of a mask blank manufacturing method and a mask blank providing method will be described with reference to FIGS. 2 to 4.

FIG. 2 is an explanatory diagram showing exchange of information between the blank manufacturing department 100 and the mask manufacturing department 200. FIG. 3 is an explanatory diagram showing a mask blank manufacturing method, a mask blank recycling method, and exchange of articles between the blank manufacturing department 100 and the mask manufacturing department 200. FIG. 4 is a flowchart showing one embodiment of a mask blank manufacturing method and a mask blank providing method.

Hereinbelow, in FIG. 4, steps 1-*a* to 1-*i* relate to a mask blank manufacturing method carried out by the blank manufacturing department 100, while, steps 2-*a* to 2-*f* relate to a mask manufacturing method carried out by the mask manufacturing department 200.

(Step 1-*a*)

At first, a thin film to become a mask pattern is formed on a mask blank substrate.

The thin film to become the mask pattern may be a light-shielding film, a phase shift film, a reflective film, an absorber film, a reflection preventing film, or the like. Each of these thin films is adapted to exert some influence on transfer exposure light, such as allow passage of the transfer exposure light or prevent passage thereof to thereby form a predetermined transfer pattern image on a transfer target. Therefore, the mask blank in this invention is used in a broad sense to include a photomask blank formed with a light-shielding film having a function to shield transfer exposure light, a phase shift mask blank formed with a phase shift film having a function to provide a phase difference to transfer exposure light, a halftone phase shift mask blank formed with an optically semi-transparent film having both a light-shielding function and a function to cause a change in phase difference with respect to transfer exposure light, a reflective mask blank formed with a reflective film having a function to reflect transfer exposure light and an absorber film having a function to absorb the transfer exposure light to thereby suppress reflection thereof, and so on.

Further, the mask blank may be an LSI (semiconductor integrated circuit) mask blank, a mask blank for any one of various PDs (panel displays), or the like, i.e. may be any one of all mask base materials.

A material of the mask blank substrate is not particularly limited. Use is made of a synthetic quartz glass, a non-alkali glass, a borosilicate glass, an aluminosilicate glass, a soda-lime glass, or the like. As a substrate material for a reflective mask, use is made of an ultra-low expansion glass or an ultra-low expansion ceramic. In FIG. 3, a halftone film 33, a light-shielding film 34, and a resist film 35 are formed on a substrate 32 in this order.

(Step 1-*b*)

Then, the resist film 35 is coated/formed on the thin film to thereby produce a resist film coated mask blank 31.

The resist film 35 may be either negative or positive. The kind of resist is also not particularly limited. For example, use can be made of one for light (ultraviolet light, extreme ultraviolet light, or the like) exposure writing, electron-beam exposure writing, or the like.

There is no particular limitation to a coating/forming method of the resist film 35. For example, use can be made of a spin coating method, a capillary coating method, a scan coating method, or the like.

(Step 1-*c*)

Then, resist film forming information about coating/formation of the resist film 35 on the thin film in the foregoing step 1-*b* is stored.

Herein, the resist film forming information represents information that affects a change in sensitivity of the resist film 35, such as a date and time (or a date) of coating/formation of the resist film 35 on the substrate 32, a resist type, a heating condition, and a mask blank storage environment.

The resist film forming information may be stored into blank information storage means in the terminal 10 of the blank manufacturing department 100 or directly into the mask blank information storage means 110 in the server 11 that exchanges information with the mask manufacturing department 200.

(Step 1-*d*)

Then, there is prepared a blank receiving case 30 that is used when providing mask blanks to the mask manufacturing department 200, and the produced mask blanks are placed in the blank receiving case 30. Then, the resist film forming information about the mask blanks placed in the blank receiving case 30 is recorded/stored in the mask blank information storage means 110 in correlation with identification information of the mask blanks.

As means for performing the correlation between the resist film forming information and the mask blanks placed in the blank receiving case 30, there is a method of directly assigning identification information to the individual mask blanks and correlating the resist film forming information with the assigned identification information or a method of using a case number of the blank receiving case 30 and a slot number assigned to each of receiving slots in the blank receiving case 30 as identification information (in this case, the identification information for identifying the mask blank is indirectly assigned to the mask blank) and correlating the resist film forming information with the case number and each slot number, or the like.

Herein, the identification information of each mask blank may be recorded/stored in the mask blank information storage means 110 in correlation with substrate information such as defect information on the surface and the inside of the substrate, optical property information (transmittance etc.), and surface form information (surface roughness, flatness, etc.) obtained before forming the thin film and stored in a substrate information storing step and with film information such as defect information and optical property information (transmittance, reflectance, etc.) of the thin film, thin film forming information (film forming condition, film stress, etc.), and surface form information (surface roughness, flatness, etc.) obtained at the time of or after forming the thin film and stored in a film information storing step.

(Step 1-*e*)

Then, to the mask manufacturing department 200 are provided the produced mask blanks by way of being placed in the blank receiving case 30 and the resist film forming information, stored in the mask blank information storage means 110, by the use of the communication line 30 or the like. As a specific method of providing the resist film forming information, there is a method of disposing the server 11 of the blank manufacturing department 100 and the server 21 of the mask manufacturing department 200, storing the resist film forming information in the server 11 of the blank manufacturing department 100, and accessing the server 11 of the blank manufacturing department 100 from the mask manufacturing department 200 to thereby obtain the resist film forming information, a method of installing a leased line between the server 11 of the blank manufacturing department 100 and the server 21 of the mask manufacturing department 200 and directly transmitting the resist film forming information from the server 11 of the blank manufacturing department 100 to the server 21 of the mask manufacturing department 200, or the like.

(Step 2-*a*)

The mask manufacturing department 200 stores the mask blanks provided from the blank manufacturing department 100, prepares a mask blank stock list 230 based on the identification information and the resist film forming information of the mask blanks, and records/stores it in the mask blank use state storage means 210 (the terminal 20 or the server 21 of the mask manufacturing department 200).

The mask blank stock list 230 includes information such as identification information (identification number directly assigned to each mask blank, case number and slot number, or the like) for identifying the individual mask blanks, a resist type, a date and time (or a date) of coating/formation of each resist film 35, and a mask blank storage environment (storage environment in the mask manufacturing department).

The mask manufacturing department 200 stores the mask blanks, provided from the blank manufacturing department 100, in a warehouse with an environment where the rate of change in sensitivity of each resist film 35 is as small as possible or in the blank receiving case 30, until a mask manufacturing process is started.

The mask manufacturing department 200 may provide the mask blank stock list 230, stored in the mask blank use state storage means 210, to the blank manufacturing department 100 by the use of the communication line 30 or the like. Specifically, there is a method of storing the mask blank stock list 230 in the server 21 of the mask manufacturing department 200 and accessing the server 21 of the mask manufacturing department 200 from the blank manufacturing department 100 to thereby obtain the mask blank stock list 230, a method of installing a leased line between the server 21 of the mask manufacturing department 200 and the server 11 of the blank manufacturing department 100 and directly transmitting the mask blank stock list 230 from the server 21 of the mask manufacturing department 200 to the server 11 of the blank manufacturing department 100, or the like.

(Step 1-*f*)

Then, referring to the resist film forming information, the mask blank, in which a change in sensitivity of the resist film 35 exceeds a preset allowable range, is identified.

Specifically, it can be varied out by the following method.

(1) The mask manufacturing department 200 refers to the resist film forming information of the mask blank stock list 230 and estimates a change in sensitivity of the resist film 35 of each of the unused mask blanks (step 2-*b*).

The change in sensitivity of the resist film 35 can be estimated by the use of the information such as the date and time (or date) of coating/formation of the resist film 35, the resist type, and the mask blank storage environment and on the basis of the past-experimental rule. For example, there is a method of setting a time limit of use per resist type and comparing this time limit of use with the resist forming date and time or a method of correcting the time limit of use in terms of the mask blank storage environment information.

(2) The mask manufacturing department 200 identifies the mask blank in which the change in sensitivity of the resist film 35 exceeds the preset allowable range, among the mask blanks in the mask blank stock list 230 (step 2-*c*).

The foregoing allowable range can be properly set so as to prevent a CD change due to a change in sensitivity of the resist film 35 from exceeding an allowable value or prevent occurrence of a pattern defect in the mask manufacturing process. Instead of the foregoing method, it is also possible to apply writing and development to the resist film 35 of the mask blank to actually derive a CD change and judge whether or not it exceeds the preset sensitivity change allowable range. In this case, the mask blank exceeding the preset sensitivity change allowable range is identified among the mask blanks in the foregoing mask blank stock list 230. The foregoing steps 2-*b* and 2-*c* may be carried out by the blank manufacturing department 100. When the blank manufacturing department 100 estimates the change in sensitivity of the resist film 35, the blank manufacturing department 100 notifies its result to the server 21 of the mask manufacturing department 200 through the communication line 30, thereby recommending return of the mask blank.

(3) The mask manufacturing department 200 prepares return information about the mask blank to be returned to the blank manufacturing department 100 (step 2-*d*).

The mask blank return information is prepared by return information preparing means in the terminal 20 of the mask manufacturing department 200. The mask blank return information is sufficient if it can identify the mask blank to be returned, and includes identification information (identification information directly assigned to a mask blank, a case number of a blank receiving case and a slot number, or the like) for identifying the mask blank, a resist type, and so on.

(4) The mask manufacturing department 200 places the mask blank, to be returned to the blank manufacturing department 100, in a blank receiving case 30 and returns it to the blank manufacturing department 100, and sends the foregoing prepared mask blank return information to the blank manufacturing department 100 (step 2-*e*).

The mask blank return information may be returned while being attached to the blank receiving case 30 where the mask blank to be returned is placed, or only the mask blank return information may be transmitted to the server 11 of the blank manufacturing department 100 by the use of the communication line 30 or the like.

(5) Based on the mask blank return information, the blank manufacturing department 100 identifies the mask blank, returned from the mask manufacturing department 200, among the mask blanks in the mask blank information storage means 110.

(Step 1-*g*)

Then, the blank manufacturing department 100 strips the resist film 35 of the mask blank returned from the mask manufacturing department 200.

A method of stripping the resist film 35 can be carried out by the use of a solvent that dissolves the resist film 35 but does not damage the mask blank substrate 32 and the thin film formed on the substrate 32, by ashing, or the like.

In the case where the resist film 35 is a resist film of a chemically amplified resist or a novolak-based resist, it is preferable to use an alkaline solvent and/or an organic solvent because the resist film 35 can be stripped without damaging the mask blank substrate 32 and the thin film which will become a mask pattern.

On the other hand, in the case where the resist film 35 is a resist film of a polymer resist, it is preferable to use an organic solvent because the resist film 35 can be stripped without damaging the mask blank substrate 32 and the thin film which will become a mask pattern.

(Step 1-h)

Then, the blank manufacturing department 100 produces a resist film coated mask blank 31 by coating/forming a resist film 35 again on the substrate 32 formed with the thin film which will become a mask pattern. Then, the blank manufacturing department 100 updates the resist film forming information, stored in the mask blank information storage means 110, with newly formed resist film forming information and stores it.

(Step 1-i)

Then, the blank manufacturing department 100 provides the produced mask blank to the mask manufacturing department 200 along with the updated resist film forming information. The mask manufacturing department 200 transfers the provided mask blank to the mask manufacturing process and produced an exposure mask (step 2-f).

In the foregoing mask blank manufacturing method, there may be provided, before step 1-a, a substrate information obtaining step of obtaining substrate information including defect information on the surface and the inside of the substrate, optical property information (transmittance etc.), surface form information (surface roughness, flatness, etc.), and so on and a step of storing the substrate information. There may also be provided, between step 1-b and step 1-c, a film information obtaining step of obtaining film information about the thin film including thin film defect information, optical property information (transmittance, reflectance, phase difference, etc.), thin film forming information (film forming condition, film stress, etc.), surface form information (surface roughness, flatness, etc.), and so on and a step of storing the film information. In the case where these steps are provided, the foregoing substrate information and/or film information is recorded/stored in the mask blank information storage means 110 in correlation with the identification information of the mask blank.

In the case where the mask blank produced by recoating/re-forming the resist on the mask blank returned from the mask manufacturing department 100 is provided to the mask manufacturing department 200 along with the film information about the thin film, it is preferable to perform, between step 1-g and step 1-h, steps of remeasuring film information about the thin film that was in contact with the resist film 35 and recording/storing it in the mask blank information storage means 110. The remeasured thin film information may be rewritten over the thin film information before the return or stored in correlation with the thin film information before the return.

In the case where the thin film is a stacked film in which thin films are stacked in layers, with respect to the film information about the thin film on the substrate side that was not in contact with the resist film 35 and the substrate information, the film information previously provided to the mask manufacturing department 200 is read out based on the return information of the mask blank returned from the mask manufacturing department 200 and can be used as it is. Therefore, it is sufficient to remeasure only the film information about the thin film that was in contact with the resist film 35 and record/store it.

EXAMPLE

A defect inspection of the precision-polished surfaces of synthetic quartz glass substrates 32 was carried out to obtain defect information about the substrates 32. Further, the surface roughness and the flatness of the glass substrate surfaces were measured to obtain surface form information. These information was recorded/stored per substrate 32 in the blank information storage means of the terminal 10 of the blank manufacturing department 100.

Then, a halftone film 33 in the form of a molybdenum silicide nitride film to become a mask pattern was formed on each synthetic quartz glass substrate 32 by sputtering.

Then, a defect inspection of each halftone film 33 was carried out to obtain film information of each halftone film 33. As the film information, position information (x-coordinate, y-coordinate) of a defect having a possibility to cause pattern failure in the mask manufacturing process, the size of the defect (the size may be indicated by rank), and the kind of the defect (pinhole, particle, or the like) were obtained by a defect inspection apparatus, and its results were recorded/stored per mask blank in the blank information storage means of the terminal 10 of the blank manufacturing department 100. Further, as the film information, the optical properties such as transmittance and phase difference measured by a spectrophotometer and a phase difference measuring apparatus, the surface form information such as surface roughness and flatness of the film surface measured by a surface roughness measuring apparatus and a flatness measuring apparatus, and so on may also be recorded/stored per mask blank in the blank information storage means.

The foregoing position information is stored as x- and y-coordinates of each defect in an XY coordinate system formed by calculating, as a reference point (O), the center of the main surface of the glass substrate from the size of the glass substrate on the basis of a notch mark and using, as virtual X- and Y-axes, lines passing through the reference point and parallel to sides of the glass substrate. Herein, the foregoing particle represents a state where a granular substance is adhered on the film or in the film, while, the pinhole represents a trace where a granular substance once adhered in the film has fallen off, i.e. a film fall-off state. The film fall-off represents either of a state with no film at all where the state of an underlayer of the film can be confirmed and a state with a locally thinned film thickness where the state of an underlayer of the film cannot be confirmed.

Then, a light-shielding film 34 with reflection preventing function in the form of a stacked film of chromium nitride film/chromium carbide film/chromium oxynitride film was formed on each halftone film 33 by sputtering.

Then, like the foregoing, a defect inspection of each light-shielding film 34 with reflection preventing function was carried out to obtain film information of each light-shielding film 34 and the obtained film information of the light-shielding film 34 was recorded/stored per mask blank in the blank information storage means of the terminal 10 of the blank manufacturing department 100.

Herein, like the foregoing, the optical properties such as transmittance and reflectance, the surface form information such as surface roughness and flatness, and so on may be recorded/stored per mask blank in the blank information storage means as the film information of the light-shielding film 34.

Then, a chemically amplified resist (manufactured by Fujifilm Arch Co., Ltd.: FEP171) was coated/formed on each light-shielding film 34 by a spin coating method and, thereafter, a heat treatment was carried out to thereby produce a plurality of resist film coated halftone phase shift mask blanks 31 (hereinafter referred to as mask blanks) for ArF excimer laser exposure.

Herein, a defect inspection of each resist film 35 may be carried out to obtain film information of each resist film 35. In this case, like the foregoing, the obtained film information of the resist film 35 is recorded/stored per mask blank in the blank information storage means of the terminal 10 of the blank manufacturing department 100.

Then, the plurality of produced mask blanks 31 were placed in a blank receiving case 30. The blank receiving case 30 is assigned a unique case number. This case number, combined with a slot number, serves as identification information adapted to specify/identify the mask blank 31. The case number is not limited to be visible. For example, it may be one that is optically or magnetically readable, such as a barcode, a magnetic recording medium, or an IC chip.

The blank receiving case 30 has a lid and an outer box, and an inner box is further received in the outer box. The inner box is formed with a plurality of slots (partitions) extending from upper to lower and adapted to receive the plurality of mask blanks 31 in grooves between the slots. Although the slot is a partition between the mask blanks, a groove portion for receiving the mask blank 31 is called a slot for the sake of explanation. For example, in the case where there are grooves for receiving five mask blanks 31, the grooves are assigned slot numbers and called slot No. 1, slot No. 2, . . . slot No. 5, respectively.

The resist film forming information, the thin film information, and the substrate information, recorded/stored in the respective terminals, about the mask blanks placed in the blank receiving case 30 were recorded/stored in the mask blank information storage means 110 provided in the server 11 of the blank manufacturing department 100. The specific information recorded/stored in the mask blank information storage means 110 includes the case number and the slot numbers (mask blanks are identified by using both of them), the substrate information, the thin film information, the type of the resist (specifically, FEP171) formed in each mask blank 31, coating/formation date and time, and a mask blank storage environment (with or without a desiccant, nitrogen-sealed, etc.).

Then, the mask blanks 31 placed in the blank receiving case 30 were provided to the mask manufacturing department 200. Further, the substrate information, the thin film information, and the resist film forming information stored in the mask blank information storage means 110 were provided to the mask manufacturing department 200 through the communication line 30. Specifically, the server 11 of the blank manufacturing department 100 and the server 21 of the mask manufacturing department 200 were connected to each other through the network 32, the resist film forming information, the thin film information, and the substrate information about the mask blanks 31 provided to the mask manufacturing department 200 were stored in the server 11 of the blank manufacturing department 100, and the server 21 of the mask manufacturing department 200 accessed the server 11 of the blank manufacturing department 100 to thereby obtain the resist film forming information, the thin film information, and the substrate information about the delivered mask blanks 31.

The mask manufacturing department 200 performed collation between the delivered mask blanks 31 and the resist film forming information obtained from the server 11 of the blank manufacturing department 100, and recorded these information in the mask blank stock list 230 of the mask blank use state storage means 210 provided in the server 21 of the mask manufacturing department 200. The specific information recorded in the mask blank stock list 230 includes the identification information (specifically, the case number and the slot numbers of the blank receiving case 30) for identifying the individual mask blanks 31, the resist type (specifically, FEP171 (positive chemically amplified resist manufactured by Fujifilm Arch Co., Ltd.)), the date and time of coating/forming each resist film 35, a mask blank storage environment (storage environment in the blank receiving case 30 and storage environment in the mask manufacturing department 200), and so on.

According to an order from a semiconductor manufacturer, the mask manufacturing department 200 selects, from the mask blank stock list 230, the mask blanks 31 to be used for manufacturing masks and starts the mask manufacturing process. In this event, the information about the selected mask blanks 31 is deleted from the mask blank stock list 230 (or information indicative of having been used is added).

Then, based on the resist film forming information and the mask blank storage environment in the mask blank stock list 230, the mask manufacturing department 200 estimated a change in sensitivity of the resist film 35 of each of the unused mask blanks 31. The mask manufacturing department 200 derived a sensitivity change allowable range of the resist film 35 not causing occurrence of CD failure, estimated a date and time exceeding the allowable range, and stored them in the mask blank stock list 230. Specifically, a change in CD average value in the mask blank plane up to 15 nm was set as the allowable range.

When there was the mask blank 31 with the resist film 35 whose sensitivity change exceeded the preset allowable range, the mask manufacturing department 200 identified it in the mask blank stock list 230 and returned the identified mask blank 31 to the blank manufacturing department 100.

When returning the mask blank 31 to the blank manufacturing department 100 from the mask manufacturing department 200, the mask manufacturing department 200 prepared a mask blank return list and provided it to the blank manufacturing department 100 along with the mask blank 31. The mask blank return list may be attached to a blank receiving case 30 receiving therein the mask blank 31 to be returned or may be provided through the communication line and the servers. The mask blank return list is sufficient if it includes information that can identify the mask blank 31 to be returned and, specifically, includes the case number and the slot number of the blank receiving case 30 where the mask blank 31 to be returned was placed at the time of the reception in the mask manufacturing department 200. The mask blank return list may also include information about the resist type.

The blank manufacturing department 100 identified, among the mask blanks in the mask blank information storage means 110, the mask blank 31 returned from the mask manufacturing department 200.

Then, the resist film 35 formed in the mask blank 31 was stripped with a stripping solution (specifically, an alkaline solvent) and the surface of the light-shielding film stripped of the resist film 35 was cleaned.

Further, like the foregoing, a defect inspection of the light-shielding film 34 with reflection preventing function was carried out to obtain film information of the light-shielding film 34, and the obtained film information of the light-shielding film 34 was recorded/stored as information of the mask blank 31 identified by the blank information storage means of the terminal 10 of the blank manufacturing department 100.

Then, a resist film 35 was again coated/formed on the light-shielding film 34 to thereby produce a resist film coated mask blank 31. The produced mask blank 31 is provided to the mask manufacturing department 200 again. The mask blank 31 provided again to the mask manufacturing department 200 hardly has a change in resist sensitivity and thus causes no CD failure due to a change in resist sensitivity.

The substrate information, the thin film information, and the resist film forming information about the mask blank 31 provided again to the mask manufacturing department 200 are updated and then provided to the mask manufacturing department 200. Herein, with respect to the film information of the halftone film 33 among the thin film information to be provided to the mask manufacturing department 200, the previously provided film information about the halftone film 33 can be utilized and provided as it is. On the other hand, with respect to the film information of the light-shielding film 34, it is preferable to perform a defect inspection again and provide updated film information about the light-shielding film 34.

In the blank manufacturing department 100, it may be arranged that the mask blank 31 returned from the mask manufacturing department 200 is identified based on the return information of the mask blank 31, a resist film 35 is newly formed on another thin film coated substrate 32 formed with a thin film (a halftone film 33 and a light-shielding film 34) having the same optical properties as the identified mask blank 31 to thereby produce a resist film coated mask blank 31, information about a date of the formation of the resist film is stored, and this mask blank 31 is provided to the mask manufacturing department 200 along with information such as resist film forming information including the foregoing date information.

INDUSTRIAL APPLICABILITY

This invention is applicable to a method of manufacturing a resist film coated mask blank, a mask blank recycling method, and a mask blank managing system including terminals and a server of a blank manufacturing department and terminals and a server of a mask manufacturing department. By applying this invention, occurrence of CD failure due to a change in sensitivity of a resist film can be suppressed in the manufacture of an exposure mask, thus being quite useful.

The invention claimed is:

1. A mask blank manufacturing method for forming a resist film on a thin film of a thin film coated substrate formed on a mask blank substrate with the thin film, which becomes a mask pattern, comprising the steps of:
storing resist film forming information including information that affects sensitivity change of the resist film,
correlating said resist film forming information with the mask blank based upon the identification information that is directly or indirectly assigned to the mask blank,
providing the mask blank from a mask blank manufacturing department into a mask manufacturing department,
stripping the resist film of the mask blank which has the resist film whose sensitivity change exceeds an allowable range and which has been returned to the mask blank manufacturing department from the mask manufacturing department, based on a correlation between the resist film forming information and the mask blank, the resist film being formed on the thin film before forming the mask pattern, and
forming again a resist film on the thin film stripped of the resist film by reutilizing film information of the thin film, the film information being obtained at the time of or after formation of the thin film and being stored in correlation with the mask blank, to thereby re-manufacture a resist film coated mask blank in the mask blank manufacturing department
wherein the film information includes substrate side film information about the thin film on a substrate side that is not in contact with the resist film in case where the thin film is a stacked film in which thin films are stacked in layers and includes defect information.

2. A mask blank manufacturing method according to claim 1, wherein:
the resist film stripping step identifies the mask blank having the resist film whose sensitivity change exceeds the allowable range and strips the resist film formed in the identified mask blank.

3. A mask blank manufacturing method according to claim 1, wherein:
the mask blank having the resist film whose sensitivity change exceeds the allowable range is identified in the mask manufacturing department.

4. A mask blank manufacturing method according to claim 1, wherein:
the resist film forming information includes any one of a date of coating/formation of the resist film on the thin film coated substrate, a resist type, a heating condition and a mask blank storage environment.

5. A mask blank manufacturing method according to claim 1, further comprising the steps of:
obtaining and storing film information of the thin film relating to a specification of the mask blank at the time of or after the formation of the thin film, and correlating the film information with the mask blank.

6. A mask blank manufacturing method according to claim 5, wherein:
the film information includes any of optical property information, thin film forming information, and surface form information.

7. A mask blank manufacturing method according to claim 5, wherein the film information of the thin film is correlated with the mask blank based upon the identification information.

8. A mask blank manufacturing method according to claim 1, further comprising the steps of:
obtaining and storing substrate information of the mask blank substrate relating to a specification of the mask blank, and
correlating the substrate information with the mask blank.

9. A mask blank manufacturing method according to claim 8, wherein:
the substrate information includes any of defect information, optical property information, and surface form information.

10. A mask blank manufacturing method according to claim 1, wherein:
the resist film is a chemically amplified resist film.

11. A mask blank manufacturing method according to claim 1, wherein:
the resist film is stripped with an alkaline solvent and/or an organic solvent.

12. A mask manufacturing method, comprising the step of:
patterning the thin film of the mask blank obtained by the mask blank manufacturing method according to claim 1 to thereby form a mask pattern on the mask blank substrate.

13. A mask blank re-manufacturing method for reforming a resist film on a thin film of a thin film coated substrate formed on a mask blank substrate with the thin film, which becomes a mask pattern, comprising the steps of:

correlating resist film forming information including information that affects sensitivity change of the resist film with the mask blank, based upon identification information that is directly or indirectly assigned to the mask blank, specifying the mask blank which has the resist film whose sensitivity change exceeds an allowable range, based on a correlation between the resist film forming information and the mask blank, stripping the resist film of the specified mask blank, and forming again a resist film on the thin film stripped of the resist film by reutilizing film information of the thin film, the film information being obtained at the time of or after formation of the thin film and being stored in correlation with the mask blank, wherein the film information includes substrate side film information about the thin film on a substrate side that is not in contact with the resist film in case where the thin film is a stacked film in which thin films are stacked in layers and includes defect information.

14. A mask blank re-manufacturing method according to claim 13, wherein:

the resist film forming information includes any one of a date of coating/formation of the resist film on the thin film coated substrate, a resist type, a heating condition and a mask blank storage environment.

15. A mask blank re-manufacturing method according to claim 14, wherein:

the substrate information includes any of defect information, optical property information, and surface form information.

16. A mask blank re-manufacturing method according to claim 13, wherein:

the film information includes any of optical property information, thin film forming information, and surface form information.

17. A mask blank re-manufacturing method according to claim 13, wherein:

the resist film is a chemically amplified resist film.

18. A mask blank re-manufacturing method according to claim 13, wherein:

the mask blank is correlated with substrate information of the mask blank substrate relating to a specification of the mask blank, based upon the identification information.

19. A mask blank re-manufacturing method according to claim 13, wherein:

the mask blank is correlated with the film information of the thin film, based upon the identification information.

* * * * *